Oct. 21, 1958 V. D. FARRIS 2,857,296

METHODS OF FORMING A JUNCTION IN A SEMICONDUCTOR

Filed Aug. 2, 1956

INVENTOR
VICTOR DESMOND FARRIS
BY Fischleten, Fischleten & Ottinger
ATTORNEYS

United States Patent Office 2,857,296

Patented Oct. 21, 1958

2,857,296

METHODS OF FORMING A JUNCTION IN A SEMICONDUCTOR

Victor Desmond Farris, Harrow, England, assignor to The General Electric Company Limited, London, England Application August 2, 1956, Serial No. 601,718

Claims priority, application Great Britain August 4, 1955

4 Claims. (Cl. 148—1.5)

Figure 2:
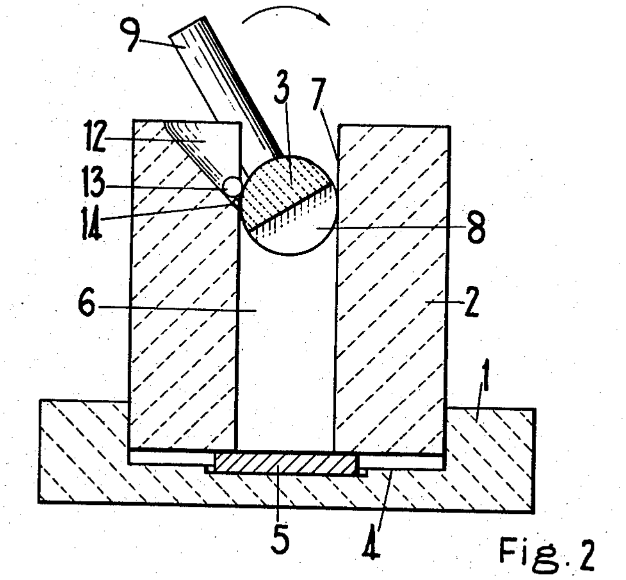

This invention relates to methods of forming a junction in a semiconductor. By a junction is meant a boundary between two regions of a semi-conductor having appreciably different electrical characteristics; a common example of such a junction is a so-called P-N junction.

One known method of forming a junction in a semiconductor comprises the steps of fusing in contact with a solid body of the semiconductor a material which incorporates a substance capable of acting in the semiconductor as a significant impurity (that is to say an impurity whose presence in the solid semiconductor modifies the electrical characteristics of the semiconductor) and which dissolves part of the body, and subsequently solidfying the molten material in such a manner that a solid layer of the semiconductor containing said substance is deposited contiguous with the remainder of the body from the molten material. In one specific application of this method the semiconductor is silicon and the material which is fused is tin alloyed with the desired impurity.

It has been found difficult to prepare by this method junctions of relatively large area having uniformly good electrical properties over the whole of the junction, such as may be required, for example, in P-N junction rectifiers designed to operate at high power levels; the failure of the known method in such cases appears to be largely due to the difficulty of obtaining sufficiently intimate initial contact over a relatively large area between the semiconductor and the material which is to be fused.

The present invention provides an alternative method of forming a junction in silicon, in which such difficulties are substantially alleviated.

According to the invention, there is provided a method of forming a junction in silicon in which molten tin is dropped on to a solid body of silicon through an aperture in a mask in contact with the body, the temperatures of the silicon body and the molten tin being at least 1050° C. and a substance capable of acting in silicon as a significant impurity being dissolved at some stage in the molten tin, and the molten tin is subsequently solidified, after it has dissolved part of the silicon body, in such a manner that a layer of solid silicon containing said substance is deposited contiguous with the remainder of the body from the molten tin.

It has been found that with such a method, the molten tin spreads over and wets substantially the whole of the area of the surface of the silicon body defined by the aperture in the mask, even where this area is relatively large (say greater than one square millimetre), so that the formation of the junction takes place substantially uniformly over this area.

In one specific application of the method, a P-N junction may be formed by utilising a silicon body of N-type conductivity together with molten tin containing in solution about 1% by weight of aluminium.

Figure 1:
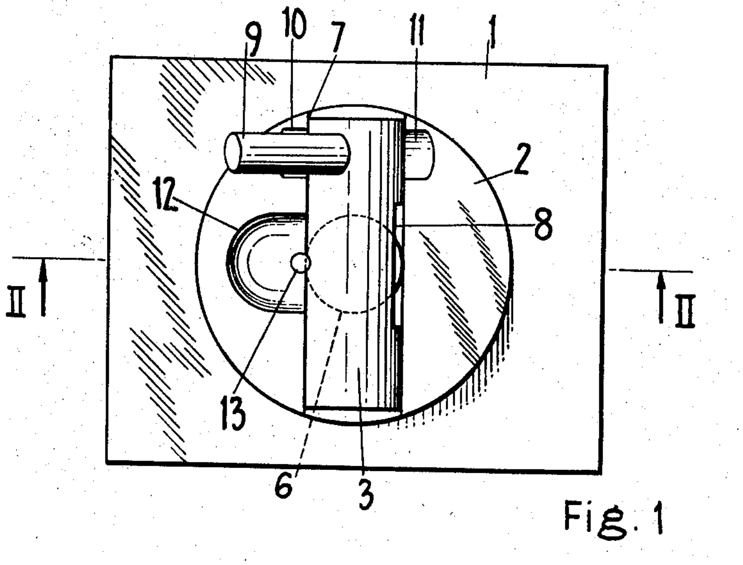

One arrangement in accordance with the invention will now be described by way of example with reference to the accompanying drawings, in which:

Figure 1 is a plan of a jig used in the manufacture of a silicon P-N junction rectifier; and Figure 2 is a section on the line II—II in Figure 1.

Referring to the drawings, the jig is made from a suitable refractory material such as pyrophyllite, and consists of three parts, a base 1, a cylinder 2, and a rod 3. The base 1 has a recess 4 formed in its upper surface, and in this recess 4 is placed a wafer 5 of N-type silicon having a resistivity of about 20 ohm centimetres and a thickness of about 0.2 millimetre. Shortly before it is placed in the jig, the silicon wafer 5 is etched by immersing it for a few minutes in a reagent consisting of three volumes of glacial acetic acid, five volumes of concentrated nitric acid and three volumes of hydrofluoric acid, together with about 0.3% of bromine. After the silicon wafer 5 is placed in the jig, the cylinder 2 is placed on the base 1 with its lower end located in the recess 4 so as to rest on the upper main face of the wafer 5. The cylinder 2 has formed in it an axial hole 6 of circular cross-section having an area of about 0.2 square centimetre, and it will be appreciated that the cylinder 2 effectively constitutes a mask in contact with the silicon wafer 5 having an aperture which defines an area of about 0.2 square centimetre on the upper main face of the wafer 5.

The cylinder 2 has a diametral groove 7 cut across its upper end, the base of the groove 7 being of semi-circular cross-section. The rod 3 is disposed in the groove 7, and has a diameter equal to that of the base of the groove 7. The rod 3 has a slot 8 cut in it half-way along its length, and has attached to it near one end an arm 9 by means of which the rod 3 can be rotated about its axis in the groove 7, slots 10 and 11 being cut in the upper end of the cylinder 2 to accommodate the arm 9. The cylinder 2 also has a recess 12 cut in its upper end, the recess 12 having a sloping base and communicating with the groove 7. Pellets 13 and 14, consisting respectively of about 0.1 gram of spectroscopically pure tin and about 0.001 gram of spectroscopically pure aluminium, are placed in the recess 12 so as to rest against the rod 3 with the rod 3 in the position shown in the drawing, the pellet 13 being disposed above, but out of contact with, the pellet 14.

The jig containing the wafer 5 and pellets 13 and 14 is caused to travel through a tubular enclosure through which is passed an atmosphere of "forming gas" (which consists of 85% nitrogen and 15% hydrogen), the central part of the enclosure being heated to a temperature of about 1150° C. and its ends being cooled by means of coils of tubing through which cold water is passed. The speed at which the jig travels through the enclosure is such that it takes about 30 minutes to reach the temperature of 1150° C., is maintained at this temperature for a few minutes, and then cools to room temperature in about 30 minutes. During the early stages of the heating the pellets 13 and 14 are melted, thereby producing droplets of molten tin and aluminium which remain out of contact because of their surface tension. When the jig reaches the central part of the enclosure the molten tin is automatically released on to the surface of the silicon wafer 5 by virtue of the upper end of the arm 9 coming into contact with a projection in the enclosure which causes rotation of the rod 3 about its axis in the sense indicated by the arrow shown in Figure 2; this brings the slot 8 into register with the recess 12, so that the molten tin drops through the hole 6 on to the upper surface of the wafer 5, the molten tin spreading over and wetting substantially the whole of the exposed area of this surface. As it falls the molten tin gathers the molten aluminium and takes it into solution, the droplet of molten aluminium being too small to fall of its own accord.

The molten tin dissolves part of the wafer 5 so as to form a shallow pit extending inwards into the wafer 5 from its upper surface. During the cooling of the jig the molten tin is resolidified, the solidification proceeding in such a manner that the initial material solidifying consists of a layer of silicon which is deposited on the base of the pit formed in the wafer 5, this layer containing an appreciable concentration of aluminium and therefore being of P-type conductivity; the remainder of the molten material solidifies in the form of a bead which consists largely of tin and can therefore be utilised for making ohmic connection to the P-type layer of silicon. In order to prevent this bead adhering to the cylinder 2, the lower end of the surface of the hole 6 may be coated with a thin layer of graphite.

The unit produced by the method described above is removed from the jig, is immersed for about 30 seconds in the reagent referred to above to remove surface contamination, and is washed and dried; the unit is then utilised to produce a P-N junction rectifier in conventional manner. It will be appreciated that the method described may be readily utilised in continuous large scale production of rectifiers.

In alternative arrangements to that described above, it would be possible to introduce the aluminium into the tin at a different stage. Thus the pellets 13 and 14 might be replaced by a single pellet of a tin-aluminium alloy of suitable composition; alternatively the aluminium might be added to the molten tin shortly after the latter had been dropped on to the silicon.

I claim:

1. A method of forming a junction in silicon, in which a body of molten tin is dropped on to a solid body of silicon through an aperture in a mask in contact with the body, the temperatures of the silicon body and the molten tin being at least 1050° C. and an effective amount of a substance capable of acting in silicon as a significant impurity being dissolved at some stage in the molten tin, and the molten tin is subsequently solidified, after it has dissolved part of the silicon body, in such a manner that a layer of solid silicon containing said substance is deposited contiguous with the remainder of the body from the molten tin.

2. A method according to claim 1, in which the silicon body is of N-type conductivity and the molten tin contains in solution about 1% by weight of aluminium.

3. A method according to claim 1, in which the silicon and tin are heated together in a jig to the required temperature before the tin is dropped on to the silicon.

4. A method according to claim 3, in which the jig is caused to travel through an enclosure part of which is heated to the required temperature, the tin being caused to drop on to the silicon when the jig reaches said part of the enclosure.

References Cited in the file of this patent

UNITED STATES PATENTS

| | | |
|---|---|---|
| 2,415,841 | Ohl | Feb. 8, 1947 |
| 2,428,992 | Ransley | Oct. 14, 1947 |
| 2,603,693 | Kircher | July 15, 1952 |
| 2,629,672 | Sparks | Feb. 24, 1953 |
| 2,697,052 | Dacey et al. | Dec. 14, 1954 |
| 2,712,621 | North | July 5, 1955 |
| 2,765,245 | English et al. | Oct. 2, 1956 |
| 2,781,481 | Armstrong | Feb. 12, 1957 |